United States Patent
Valencia

(10) Patent No.: US 10,345,837 B1
(45) Date of Patent: Jul. 9, 2019

(54) CURRENT-BASED FEEDBACK CONTROL FOR VOLTAGE REGULATORS

(71) Applicant: Semtech Corporation, Camarillo, CA (US)

(72) Inventor: Miguel Valencia, Bristol (GB)

(73) Assignee: Semtech Corporation, Camarillo, CA (US)

(*) Notice: Subject to any disclaimer, the term of this patent is extended or adjusted under 35 U.S.C. 154(b) by 0 days.

(21) Appl. No.: 15/958,967

(22) Filed: Apr. 20, 2018

(51) Int. Cl.
| | | |
|---|---|---|
| *H02M 3/156* | (2006.01) | |
| *G05F 1/575* | (2006.01) | |
| *H02M 3/157* | (2006.01) | |
| *H03M 1/66* | (2006.01) | |
| *G05F 1/62* | (2006.01) | |
| *G05F 1/563* | (2006.01) | |

(52) U.S. Cl.
CPC .............. *G05F 1/575* (2013.01); *G05F 1/563* (2013.01); *G05F 1/62* (2013.01); *H02M 3/157* (2013.01); *H03M 1/66* (2013.01)

(58) Field of Classification Search
CPC .......... G05F 1/614; G05F 1/618; G05F 1/613; G05F 1/42; G05F 1/607; G05F 3/12; H02M 3/156; H02M 3/1588; H02M 2003/1566; H02M 3/155; H02M 3/1582
See application file for complete search history.

(56) References Cited

U.S. PATENT DOCUMENTS 6,771,200 B2* 8/2004 Frulio .................... G11C 5/145
 341/120
2017/0040892 A1* 2/2017 Rutkowski ............ H02M 3/158

OTHER PUBLICATIONS

SW Lee, Practical Feedback Loop Analysis for Voltage-Mode Boost Converter, 14 pages, Texas Instruments Application Report SLVA633, Jan. 2014.

* cited by examiner

*Primary Examiner* — Adolf D Berhane
*Assistant Examiner* — Afework S Demisse
(74) *Attorney, Agent, or Firm* — Brian M. Kaufman; Robert D. Atkins; Atkins and Associates, P.C.

(57) ABSTRACT

A voltage regulator has a comparator and a reference voltage coupled to a first input of the comparator. An output voltage of the voltage regulator is coupled to a second input of the comparator through a resistor. A current source is coupled to the second input of the comparator. The first current source can be a first digital-to-analog converter (DAC). A second current source can be coupled in parallel with the first DAC. The second current source can be a second DAC. The voltage regulator can include a boost topology.

20 Claims, 5 Drawing Sheets

CURRENT-BASED FEEDBACK CONTROL FOR VOLTAGE REGULATORS

FIELD OF THE INVENTION

The present invention relates in general to semiconductor devices and, more particularly, to a semiconductor device and method of current-based feedback control for voltage regulators.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal-oxide-semiconductor field-effect transistor (MOSFET). Integrated semiconductor devices typically contain hundreds to millions of electrical components. Examples of integrated semiconductor devices include microcontrollers, microprocessors, charge-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Many electronic devices are powered by voltage supplies that are not adequate for the semiconductor devices or other components within the electronic device. For instance, some electronic parts require 9 volts or 12 volts to operate, but are in an electronic device powered by two 1.5-volt batteries in series or 5 volts from a universal serial bus (USB) port. In other cases, a device is powered by a 5 or 12 volt source, but needs between 20 and 90 volts for a certain circuit element, e.g., an avalanche photodiode (APD).

In cases where input voltages need to be converted for powering of components, switch-mode power supplies (SMPS) are commonly used. Boost regulator 10 in FIG. 1 is one example of an SMPS topology. Boost regulator 10 receives an input voltage at $V_{IN}$ node 12, and converts the voltage to an output voltage at $V_{OUT}$ node 14. Electrical current flows through boost regulator 10 in two different paths. The first path is through inductor 18 and MOSFET 20 to ground node 24, and the second path is through inductor 18 and diode 26 to $V_{OUT}$ node 14. Electrical current flows primarily through the first path when MOSFET 20 is turned on. The electrical current through inductor 18 stores energy in the inductor through magnetization of a ferric core. The electrical current through inductor 18 reaches a fairly high magnitude because MOSFET 20 creates a substantially short circuit between $V_{IN}$ node 12 and ground node 24 through inductor 18.

When a sufficient current through inductor 18 is reached, MOSFET 20 is shut off, and current flows instead through inductor 18 and diode 26 to $V_{OUT}$ node 14. The energy stored magnetically in inductor 18 during the first phase results in an electrical current through diode 26 larger than what load 16 would normally draw. The excess current through diode 26 raises the voltage potential at $V_{OUT}$ node 14 above the voltage potential of $V_{IN}$ node 12. Capacitor 28 stores electrical charge not immediately usable by load 16. As load 16 uses up the electrical energy stored in capacitor 28, the voltage potential of $V_{OUT}$ node 14 drops. When the voltage of $V_{OUT}$ node 14 drops below a desired threshold, MOSFET 20 turns on and off again to inject more energy through diode 26 to $V_{OUT}$ node 14.

To determine when MOSFET 20 should turn on and off, a resistor voltage divider is formed from resistors 30 and 32 to create a feedback voltage at $V_{FB}$ node 34. The voltage potential at $V_{FB}$ node 34 is given by equation 1.

$$V_{FB} = \frac{V_{OUT} * R_{32}}{R_{30} + R_{32}} \qquad \text{Equation 1}$$

The voltage potential at $V_{FB}$ node 34 is proportional to the voltage potential at $V_{OUT}$ node 14, but reduced by the ratio of resistors 30 and 32. Comparator 40 includes a first input coupled to $V_{FB}$ node 34, and a second input coupled to a reference voltage at $V_{REF}$ node 42. Comparator 40 has an output 44 that indicates whether the voltage potential of $V_{FB}$ node 34 is above or below the voltage potential of $V_{REF}$ node 42.

Control logic 50 receives the output signal 44 from comparator 40, and turns MOSFET 20 on and off using control signal 52 based on comparator output signal 44. Several methods exist for controlling MOSFET 20 based on output signal 44. In some embodiments, control logic 50 will increase a switching frequency or duty cycle of control signal 52 when $V_{FB}$ falls below $V_{REF}$. In other embodiments, MOSFET 20 is switched at a predetermined frequency when $V_{FB}$ node 34 is below $V_{REF}$ node 42, and remains off when $V_{FB}$ node 34 is above $V_{REF}$ node 42.

An engineer designing a power supply based on voltage divider feedback generally buys a controller IC with comparator 40, $V_{REF}$ 42, and control logic 50. Given $V_{REF}$ 42 set by the controller IC manufacturer, the engineer selects resistance values of resistor 30 and resistor 32 to set the voltage potential that $V_{OUT}$ node 14 will be regulated to. The voltage potential at $V_{OUT}$ node 14 will settle at a voltage indicated by equation 2.

$$V_{OUT} = \frac{V_{REF} * (R_{30} + R_{32})}{R_{32}} \qquad \text{Equation 2}$$

Using a resistive voltage divider for feedback creates a voltage at $V_{FB}$ node 34 that is acceptable for input to comparator 40. However, the resistive voltage divider is not a flexible approach. The voltage divider is not easily calibrated to provide high-resolution voltage control in a limited voltage range of $V_{OUT}$ node 14. Moreover, the voltage divider not only reduces voltage from $V_{OUT}$ node 14 to $V_{FB}$ node 34, but also reduces the magnitude of changes in voltage. The reduction in magnitude of voltage changes from $V_{OUT}$ node 14 to $V_{FB}$ node 34 makes the control circuitry less robust against noise.

Therefore, a need exists for a more flexible feedback mechanism for voltage regulators.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
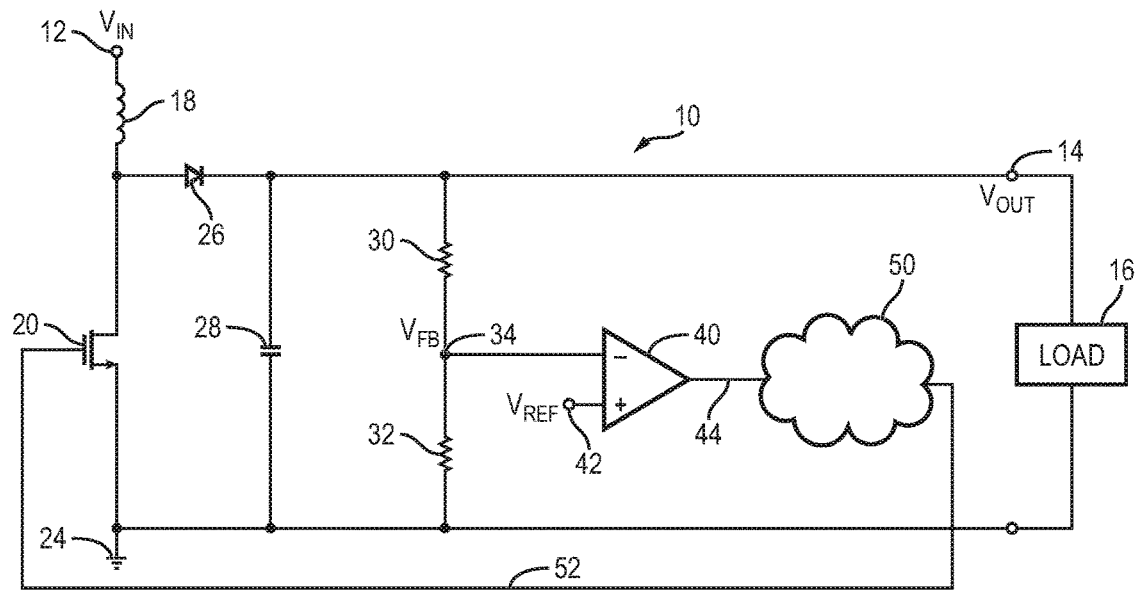
FIG. 1 illustrates a voltage regulator that creates a feedback voltage using a voltage divider.
Figure 2:
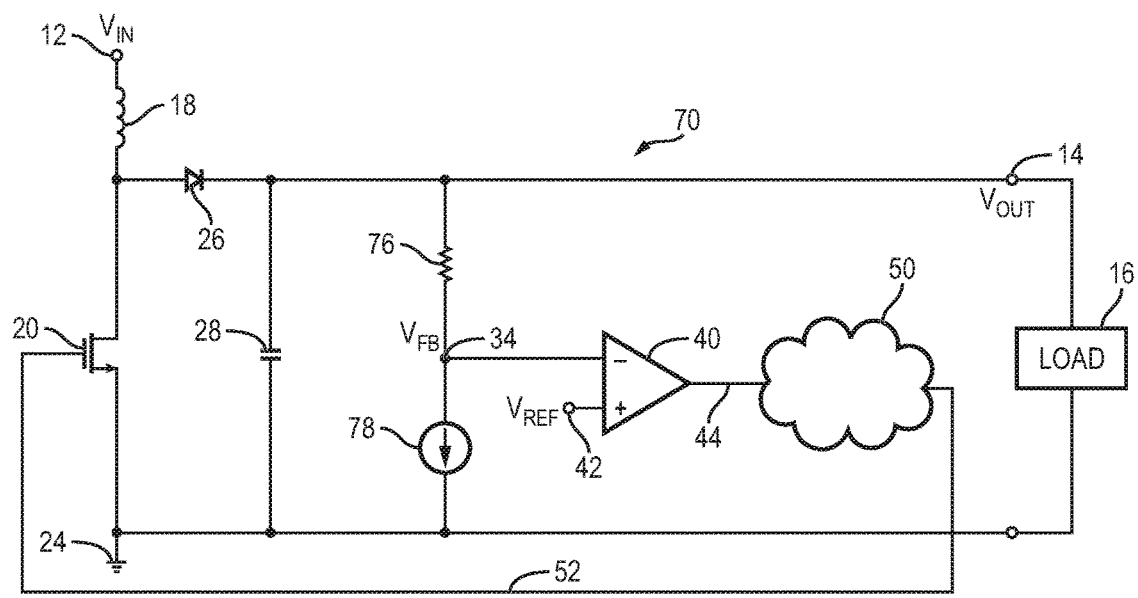
FIG. 2 illustrates a voltage regulator that creates a feedback voltage using electrical current through a resistor.

FIG. 2 illustrates voltage regulator 70 with a feedback signal at $V_{FB}$ node 34 created by resistor 76 and current source 78 rather than a voltage divider. Resistor 76 and current source 78 are coupled in series between $V_{OUT}$ node 14 and ground node 24. Current source 78 draws electrical current from $V_{OUT}$ node 14 to ground node 24 through resistor 76. The current through resistor 76 results in a voltage drop from $V_{OUT}$ node 14 to $V_{FB}$ node 34 that is equivalent to the value of the resistor multiplied by the amount of current. Electrical current through resistor 76 can be considered equal to the value of current being drawn by current source 78 for all practical purposes, even though in practice there may be a negligible difference that may or may not be detectable.

Due to electrical current through resistor 76 being practically a fixed value, the voltage drop across resistor 76 is also fixed. $V_{OUT}$ node 14 has a voltage potential that is above $V_{FB}$ node 34 by a fixed magnitude. The voltage potential of $V_{FB}$ node 34 relative to $V_{OUT}$ node 14 is given by equation 3, where $I_{78}$ indicates the magnitude of current source 78, and $R_{76}$ indicates the resistance value of resistor 76.

$$V_{FB}=V_{OUT}-(I_{78}*R_{76})\qquad\text{Equation 3:}$$

When regulator 70 is turned on, $V_{FB}$ node 34 settles at the same voltage potential as $V_{REF}$ node 42 because those are the two values being input to comparator 40. Therefore, output voltage of regulator 70 at $V_{OUT}$ node 14 is set by configuring the magnitude by which $V_{FB}$ node 34 is below $V_{OUT}$ node 14 with the design parameters of resistor 76 and current source 78. In one embodiment, a designer of a power supply buys an integrated circuit (IC) package with comparator 40, $V_{REF}$ node 42, and current source 78 integrated into the package. The designer knows the values of current source 78 and $V_{REF}$ 42 built into the IC, and selects a resistance value for resistor 76 to create a desired voltage drop across the resistor such that $V_{REF}$ 42 plus the voltage drop equals a desired voltage potential of $V_{OUT}$ node 14. The regulated voltage at $V_{OUT}$ node 14 will settle to a value proportional to the selected resistance value for resistor 76, as given by equation 4.

$$V_{OUT}=V_{REF}+(I_{78}*R_{76})\qquad\text{Equation 4:}$$

As an example, if the manufacturer of a controller IC sets $V_{REF}$ node 42 at 5 volts and current source 78 at 50 milliamps, the power supply designer could set the value of resistor 76 at 140 ohms to generate $V_{OUT}$ node 14 as a 12-volt output. Ohm's law dictates that the voltage drop across resistor 76 will be current (50 milliamps, set by IC manufacturer) multiplied by resistance (140 ohms, selected by the power supply designer). Therefore, the voltage across resistor 76 in the example will be 7 Volts. Control logic 50 will be maintaining $V_{FB}$ node 34 at approximately the same voltage potential as $V_{REF}$ node 42 (5 volts), so $V_{OUT}$ node 14 will be held at approximately 5 volts (the voltage of $V_{REF}$) plus 7 volts (the voltage across resistor 76), i.e., 12 volts.

In some embodiments, the controller IC manufacturer provides a $V_{FB}$ node 34 terminal on the package, which is directly coupled to current source 78 and comparator 40 within the package. The designer of power supply 70 selects the desired resistance value and solders resistor 76 onto a printed circuit board (PCB) or other substrate adjacent to the controller IC and electrically connected to the $V_{FB}$ node 34 terminal of the controller IC.

Current through resistor 76 is relatively constant, which means that the voltage difference between $V_{OUT}$ node 14 and $V_{FB}$ node 34 is relatively constant. There is a direct relationship between the two voltages, such that voltage fluctuations of $V_{OUT}$ node 14 are observed at $V_{FB}$ node 34 with substantially the same magnitude. Because the magnitude of voltage changes is not reduced between $V_{OUT}$ node 14 and $V_{FB}$ node 34, the feedback voltage generated with resistor 76 and current source 78 is more robust to noise compared to a voltage divider. In addition, the offset and gain of comparator 40 are less critical, enabling the use of simpler and cheaper comparators.

Figure 3:
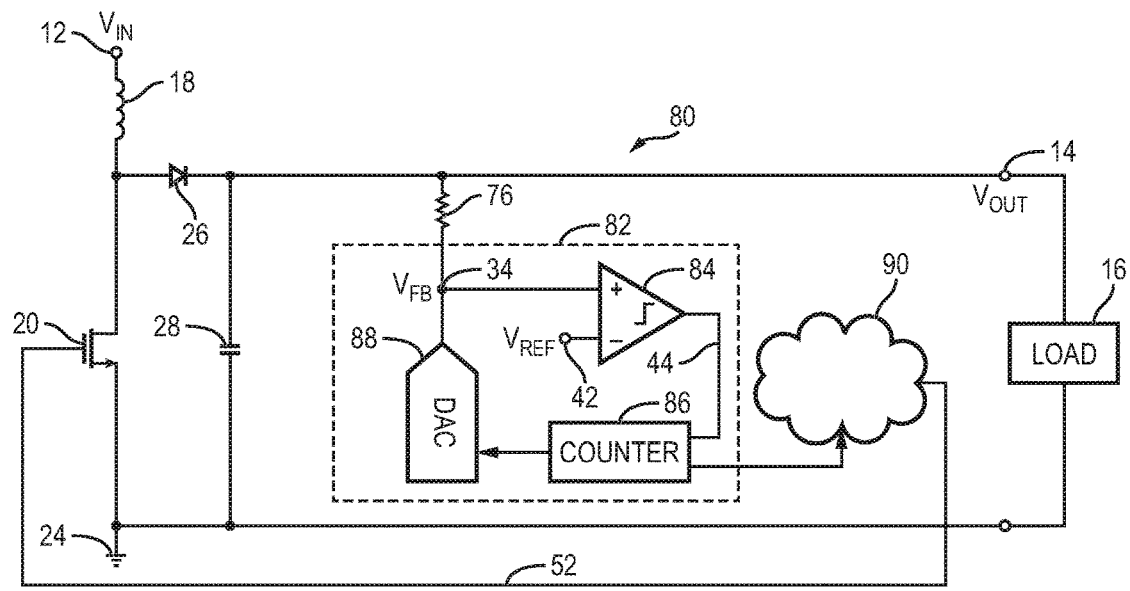
FIG. 3 illustrates a voltage regulator that creates a feedback voltage using a current-sink digital-to-analog converter (DAC) to control the magnitude of electrical current through a resistor.

FIG. 3 illustrates a voltage regulator 80 with a feedback circuit 82. Feedback circuit 82 comprises comparator 84, a counter 86, and a current-sink DAC 88. Comparator 84 compares $V_{REF}$ node 42 to $V_{FB}$ node 34, as above, and generates an output signal 44. The output signal 44 controls whether counter 86 increments or decrements.

DAC 88 is a current sink that pulls current from $V_{OUT}$ node 14 through resistor 76, with the magnitude of current being controlled by the value stored in counter 86. The voltage potential at $V_{FB}$ node 34, in turn, is controlled by the magnitude of current being drawn by DAC 88. Feedback circuit 82 operates similarly to an analog-to-digital converter (ADC). Counter 86 provides a linear representation of the voltage potential of $V_{OUT}$ node 14. A digital value in counter 86 will settle at a value proportional to an analog voltage potential at $V_{OUT}$ node 14, and can be used to control output voltage with a purely digital controller. The voltage at $V_{OUT}$ node 14 is given by equation 5. In equation 5, counter represents the digital value stored in counter 86, and $I_{LSB}$ represents the change in magnitude of current drawn by DAC 88 by changing the least significant bit of the counter.

$$V_{OUT}=V_{REF}+(\text{counter}*I_{LSB}*R_{76})\qquad\text{Equation 5:}$$

As voltage at $V_{OUT}$ node 14 rises, the voltage potential at $V_{FB}$ node 34 will rise by an approximately equal magnitude. Comparator 84 will indicate that $V_{FB}$ node 34 is at a higher voltage potential than $V_{REF}$ node 42, and cause counter 86 to count upward. The rising value in counter 86 increases the magnitude of current drawn by DAC 88 through resistor 76, which increases the voltage drop across the resistor. Counter 86 will count up until the current drawn by DAC 88 is sufficient to reduce the voltage potential at $V_{FB}$ to be less than $V_{REF}$. The amount by which counter 86 must count up is proportional to the voltage change at $V_{OUT}$ node 14.

As voltage at $V_{OUT}$ node 14 falls, the voltage potential at $V_{FB}$ node 34 falls by an approximately equal magnitude. Comparator 84 will indicate that the $V_{FB}$ node 34 is at a lower voltage potential than $V_{REF}$ node 42, and cause counter 85 to count downward. The falling value in counter 86 reduces the magnitude of current drawn by DAC 88 through resistor 76, which reduces the voltage drop across the resistor. Counter 86 will count down until the current drawn by DAC 88 is low enough to increase the voltage of $V_{FB}$ node 34 to a greater value than $V_{REF}$ node 42. The amount by which the value in counter 86 falls is proportional to the drop in voltage potential at $V_{OUT}$ node 14.

As the voltage potential of $V_{OUT}$ node 14 fluctuates, counter 86 moves proportionally. The value in counter 86 is a digital value proportional to a voltage potential at $V_{OUT}$ node 14. Control logic 90 reads the digital value in counter 86 and uses the knowledge of the output voltage to control MOSFET 20. If the value in counter 86 indicates that $V_{OUT}$ node 14 is at a lower than desired voltage potential, control logic 90 increases the frequency or duty cycle of switching MOSFET 20 to bring up the voltage of $V_{OUT}$ node 14. Control logic 90 observes the value in counter 86 to return the switching frequency to a lower value once the voltage potential at $V_{OUT}$ node 14 returns to the desired level.

One advantage of utilizing a current DAC and single resistor architecture rather than a dual-resistor voltage divider is that negative voltages can be regulated by inverting the polarity of the comparator and mirroring the DAC to a source DAC rather than a sink DAC. On the other hand, the prior art architecture generally needs an additional fixed voltage for the voltage divider. Therefore, an additional pin on the controller IC is usually required to regulate negative voltages.

Figure 4:
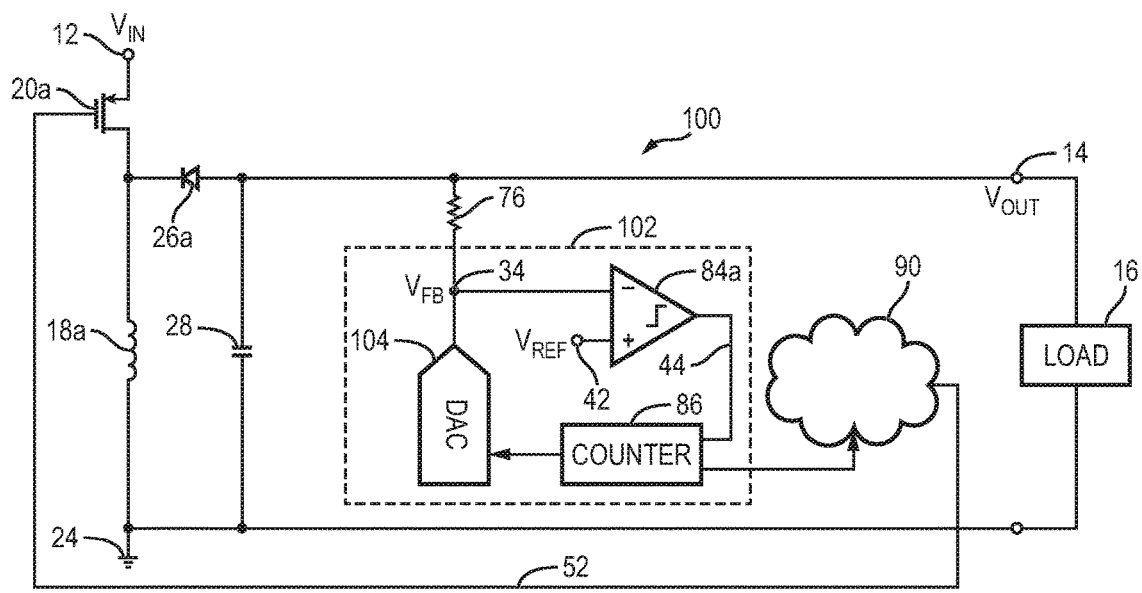
FIG. 4 illustrates a current-source DAC used to regulate a negative voltage potential.

Power regulator 100 in FIG. 4 is configured to regulate $V_{OUT}$ node 14 to a negative voltage potential. The polarity of diode 26 has been reversed, and the diode is labelled as diode 26a. The placement of inductor 18 and MOSFET 20 has been reversed, and the respective parts are labelled as 18a and 20a. MOSFET 20a is a P-channel device, whereas MOSFET 20 was an N-channel device.

FIG. 4 illustrates a feedback circuit 102 with sink DAC 88 replaced with source DAC 104. Source DAC 104 outputs an electrical current through resistor 76 to $V_{OUT}$ node 14 proportional to the value in counter 86. In some embodiments, a convertible DAC can be implemented that is configurable to be either a sink DAC or a source DAC, allowing a single controller IC to regulate positive or negative voltages. Comparator 84a is the same hardware component as comparator 84 above in some embodiments, but simply has the input polarity switched. That is, $V_{REF}$ node 42 is coupled to the inverting input rather than the non-inverting input of comparator 84. The coupling of comparator 84 inputs can be controlled electronically to allow a single comparator to be configured either for regulation of positive or negative voltages. In other embodiments, comparator 84 is configured for regulating negative voltages by inverting the output rather than swapping the inputs.

The voltage potential calculations for $V_{FB}$ node 34 and $V_{OUT}$ node 14 of negative voltage regulator 100 in FIG. 4 are similar to the positive regulator in FIG. 3. The feedback voltage is given by equation 6, and the regulated voltage is given by equation 7. Again, when regulator 100 settles, the voltage potentials of $V_{FB}$ node 34 and $V_{REF}$ node 42 will be substantially equal.

$$V_{FB} = V_{OUT} + (\text{counter} * I_{LSB} * R_{76}) \qquad \text{Equation 6:}$$

$$V_{OUT} = V_{REF} - (\text{counter} * I_{LSB} * R_{76}) \qquad \text{Equation 7:}$$

Feedback circuit 102 in FIG. 4 operates in substantially the same manner as feedback circuit 82 in FIG. 3, but is reconfigured to regulate a negative voltage instead of a positive voltage.

Figure 5A:
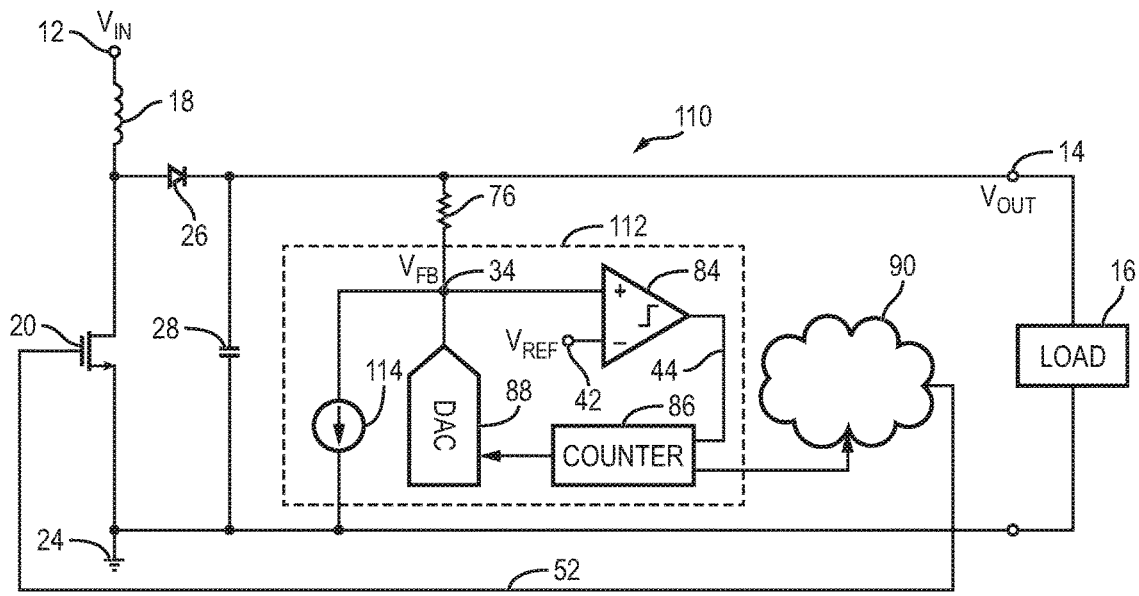
FIGS. 5a and 5b illustrate a current source in parallel with the current-sink DAC to create a voltage offset.

FIG. 5a illustrates a power regulator 110 with feedback circuit 112. Feedback circuit 112 includes current-sink DAC 88 as in FIG. 3, and a current source 114 coupled in parallel with the DAC. Comparator 84, counter 86, and DAC 88 operate in substantially the same manner as in FIG. 3 to populate counter 86 with a digital value proportional to the voltage potential at $V_{OUT}$ node 14.

Current source 114 is coupled to $V_{FB}$ node 34 in parallel with current DAC 88, and draws a fixed amount of current through resistor 76 regardless of counter 86. Current source 114 creates a voltage potential offset because of the additional current through, and voltage drop across, resistor 76. Without current source 114, when counter 86 contains the value zero, DAC 88 draws no current and the voltage potential at $V_{FB}$ node 34 equals the voltage potential at $V_{OUT}$ node 14. $V_{OUT}$ node 14 is regulated to the voltage potential of $V_{REF}$ node 42, because that is the voltage potential when $V_{FB}$ node 34 equals $V_{REF}$. The maximum regulated voltage potential without current source 114 is given by equation 7, with counter 86 being at the maximum value, e.g., 0xFF in hexadecimal for an 8-bit DAC.

Figure 5B:
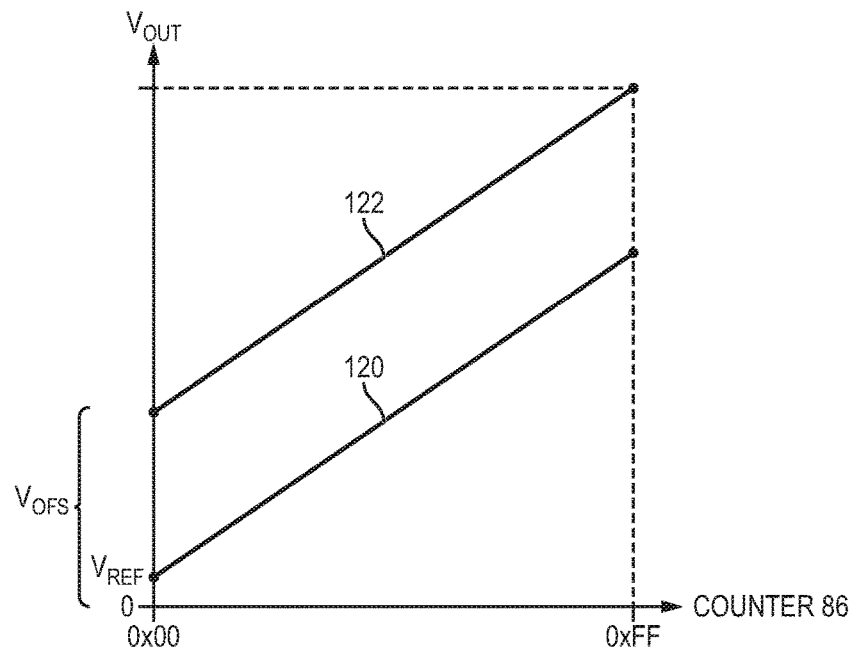

Line 120 in FIG. 5b illustrates an example plot of DAC 88 value on the horizontal axis versus output voltage on the vertical axis. A linear relationship is illustrated, with plot 120 beginning at the voltage potential of $V_{REF}$ node 42 and growing linearly as counter 86 counts from 0x00 to 0xFF. FIG. 5b presumes an 8-bit counter, but other bit-widths are used in other embodiments.

The controller IC with feedback circuit 82 in FIG. 3 can be accurately regulated to voltages near $V_{REF}$, which for a lot of use cases is not needed, and has relatively low maximum regulation voltages that may not be sufficient for all use cases. Adding current source 114 in parallel increases the voltage drop across resistor 76, and thus raises the voltage potential of $V_{OUT}$ node 114, for all values of counter 86. Plot 122 in FIG. 5b illustrates the counter 86 value versus output voltage with current source 114 added. $V_{OFS}$ indicates the difference in output voltage between a given value of counter 86 with and without current source 114. $V_{OFS}$ is given by equation 8, where $I_{114}$ is the magnitude of electrical current that current source 114 is drawing.

$$V_{OFS} = I_{114} * R_{76} + V_{REF} \qquad \text{Equation 8:}$$

Adding current source 114 shifts the voltage potential at $V_{OUT}$ node 14 up by $V_{OFS}$ for a given value of counter 86, thus raising both the minimum regulable output voltage and the maximum regulable output voltage. The range provided by line 122 in FIG. 5b is a more useful range for many purposes. For instance, an avalanche photodiode may need a voltage in the range of 30 to 50 volts, which is totally within the vertical range of line 122, while the regulator without current source 114 only allows regulation up to say 40 volts.

Figure 6A:
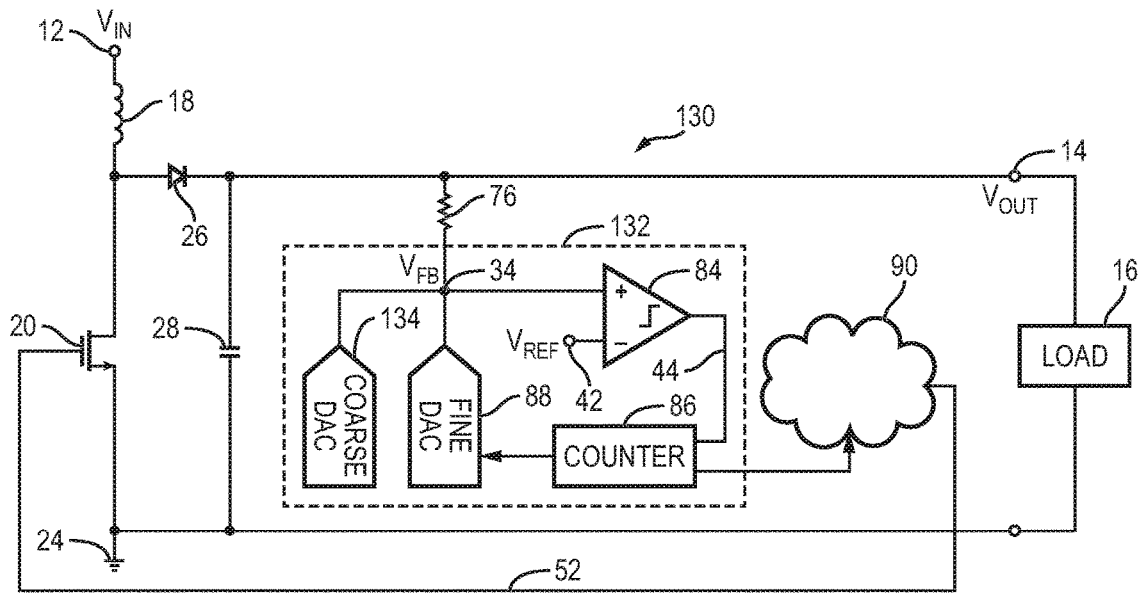
FIGS. 6a and 6b illustrate a coarse-adjustable DAC in parallel with a fine-adjustable DAC to allow the voltage regulator to be calibrated for different uses.

FIG. 6a illustrates a more flexible power regulator 130, where feedback circuit 132 has a coarse DAC 134 added in parallel with DAC 88. Coarse DAC 134 is an adjustable current source without the same level of fine adjustment that DAC 88 offers. While an 8-bit counter 86 allows for 256 different values for the current drawn by DAC 88, coarse DAC may only have four or five different settings. In one embodiment, coarse DAC 134 is simply a plurality of current sources 114 coupled in parallel, and enablable in any combination to achieve a desired $V_{OFS}$.

Figure 6B:
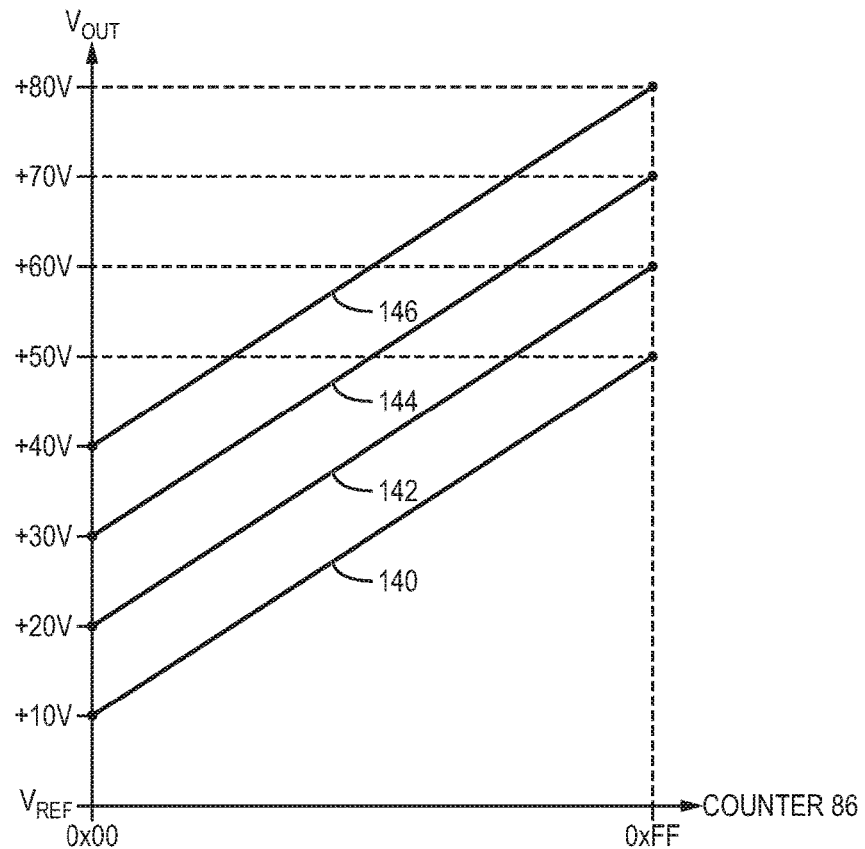

FIG. 6*b* illustrates a plurality of possible counter 86 versus $V_{OUT}$ plots depending on the value selected for coarse DAC 134. Line 140 shows the coarse DAC sinks current equivalent to a 10 volt drop across resistor 76, allowing fine DAC 88 to adjust between 10 volts and 50 volts over $V_{REF}$ node 42. Line 142 shows coarse DAC 134 set to a 20 volt offset, allowing fine DAC 88 to adjust from 20 volts to 60 volts above $V_{REF}$. Line 144 illustrates coarse DAC 134 with an offset of 30 volts, allowing fine DAC 88 to adjust from 30 volts to 70 volts above $V_{REF}$. Line 146 illustrates coarse DAC 134 set to a 40 volt offset, allowing fine DAC 88 to adjust between 40 volts and 80 volts above $V_{REF}$. In other embodiments, additional settings of coarse DAC 134 are used to apply any desired offset to the fine adjustment range of fine DAC 88. Coarse DAC 134 allows the resolution of fine DAC 88 to be shifted to a desired range. The regulated output voltage of regulator 130 is given by equation 9.

$$V_{OUT} = (I_{134} + I_{88}) * R_{76} + V_{REF} \qquad \text{Equation 9:}$$

Figure 7:
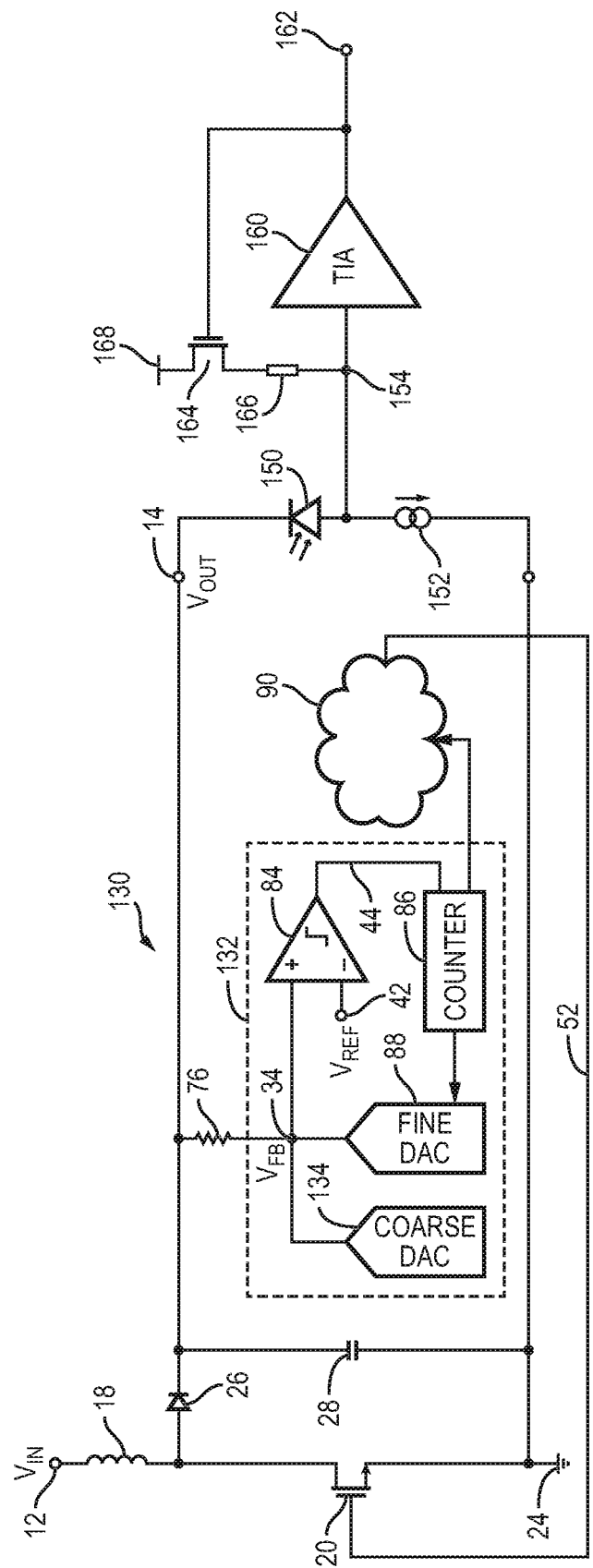
FIG. 7 illustrates a voltage regulator powering an avalanche photodiode.

One common use of the disclosed power regulators is for providing power to avalanche photodiode (APD) circuits as shown in FIG. 7. Load 16 includes an avalanche photodiode 150 and current source 152 coupled in series between $V_{OUT}$ node 14 and ground node 24. A light signal, typically delivered via a fiber optic cable, hits APD 150 and modifies the electrical resistance of the APD, which changes the voltage potential at circuit node 154. Transimpedance amplifier (TIA) 160 has an input coupled to circuit node 154, and an output at circuit node 162. A feedback path of TIA 160 comprises a MOSFET 164 and resistor 166 coupled between $V_{DD}$ 168 and circuit node 154. Semiconductor devices coupled to output node 162 receive the information from the fiber optic cable as an electrical signal.

Depending on the manufacturer and model of a particular APD 160 that is selected, the APD will require that the voltage potential at $V_{OUT}$ node 14 fall within a different range that can vary significantly. With the prior art voltage divider approach, the wider the spread of operational voltage of different APDs, the worse the resolution of the control voltage. However, the adjustment provided by coarse DAC 134 means that the fine adjustment of DAC 88 can be moved around if a particular APD 160 selected requires a different voltage range. The voltage of $V_{FB}$ node 34 always settles to be substantially equal to the voltage of $V_{REF}$ node 42, so any voltage range can be achieved as long as the current of coarse DAC 134 can be made high enough.

Another benefit of the above implementation that includes digital-to-analog converters is that the DACs can be used for other purposes if not needed for regulator control logic. Many of the ICs that include the control logic may be used in situations where an external charge pump for controlling $V_{OUT}$ node 14 is not needed. In that case, the user can still use the DAC for other purposes.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a voltage regulator, comprising:
   providing a comparator including a reference voltage coupled to a first input of the comparator;
   coupling a first current source to a second input of the comparator, wherein the first current source includes a digital-to-analog converter (DAC);
   coupling a counter between an output of the comparator and an input of the DAC; and
   coupling a resistor to the second input of the comparator.

2. The method of claim 1, further including coupling the second input of the comparator to an output voltage node through the resistor.

3. The method of claim 2, further including coupling the second input of the comparator to a ground voltage node through the first current source.

4. The method of claim 1, further including modifying a switching frequency of the voltage regulator based on an output of the comparator.

5. The method of claim 1, further including providing a second current source coupled in parallel with the first current source, wherein the first current source is fine adjustable and the second current source is coarse adjustable.

6. The method of claim 1, wherein the voltage regulator includes a boost topology.

7. A method of making a voltage regulator controller, comprising:
   providing a comparator including a reference voltage coupled to a first input of the comparator;
   coupling a first current source to a second input of the comparator; and
   providing a second current source coupled in parallel with the first current source, wherein the first current source is fine adjustable and the second current source is coarse adjustable.

8. The method of claim 7, wherein the first current source is a digital-to-analog converter (DAC).

9. The method of claim 8, further including providing a counter coupled between an output of the comparator and an input of the DAC.

10. The method of claim 7, further including coupling a voltage output terminal of the voltage regulator controller to the second input of the comparator.

11. A voltage regulator, comprising:
    a comparator including a reference voltage coupled to a first input of the comparator;
    a first current source coupled to a second input of the comparator;
    a second current source coupled in parallel with the first current source, wherein the first current source is fine adjustable and the second current source is coarse adjustable; and
    a resistor coupled to the second input of the comparator.

12. The voltage regulator of claim 11, wherein the voltage regulator includes a voltage output node coupled to the second input of the comparator through the resistor.

13. The voltage regulator of claim 12, further including a ground node, wherein the ground node is coupled to the second input of the comparator through the first current source.

14. The voltage regulator of claim 11, wherein the first current source is a digital-to-analog converter (DAC).

15. The voltage regulator of claim 14, further including a counter coupled to an output of the comparator to control the DAC.

16. The voltage regulator of claim 11, wherein the voltage regulator is a boost topology.

17. A voltage regulator controller, comprising:
- a comparator including a reference voltage coupled to a first input of the comparator;
- a first current source coupled to a second input of the comparator, wherein the first current source is a digital-to-analog converter (DAC); and
- a counter coupled between an output of the comparator and an input of the DAC.

18. The voltage regulator controller of claim 17, further including a second current source coupled in parallel with the first current source.

19. The voltage regulator controller of claim 18, wherein the first current source is fine adjustable and the second current source is coarse adjustable.

20. The voltage regulator controller of claim 17, wherein a voltage output terminal of the voltage regulator controller is coupled to the second input of the comparator.

* * * * *